(12) United States Patent
Hsu et al.

(10) Patent No.: US 9,443,954 B2
(45) Date of Patent: Sep. 13, 2016

(54) METHOD FOR MANUFACTURING SEMICONDUCTOR DEVICE HAVING METAL GATE

(71) Applicant: UNITED MICROELECTRONICS CORP., Hsin-Chu (TW)

(72) Inventors: Chih-Kai Hsu, Tainan (TW); Yu-Hsiang Hung, Tainan (TW); Ssu-I Fu, Kaohsiung (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/009,808

(22) Filed: Jan. 28, 2016

(65) Prior Publication Data

US 2016/0197162 A1 Jul. 7, 2016

Related U.S. Application Data

(62) Division of application No. 14/537,840, filed on Nov. 10, 2014, now Pat. No. 9,287,263.

(30) Foreign Application Priority Data

Oct. 8, 2014 (TW) .............................. 103135079 A

(51) Int. Cl.
*H01L 27/02* (2006.01)
*H01L 29/66* (2006.01)
*H01L 21/8238* (2006.01)
*H01L 21/28* (2006.01)

(52) U.S. Cl.
CPC ... *H01L 29/66545* (2013.01); *H01L 21/28088* (2013.01); *H01L 21/823842* (2013.01)

(58) Field of Classification Search
CPC ................ H01L 21/28088; H01L 21/823842; H01L 27/0922; H01L 29/4966
USPC .......................................................... 438/305
See application file for complete search history.

(56) References Cited

U.S. PATENT DOCUMENTS

| | | |
|---|---|---|
| 8,586,436 B2 | 11/2013 | Ng |
| 8,669,618 B2 | 3/2014 | Fu |
| 8,722,491 B2 | 5/2014 | Park |
| 8,741,717 B2 | 6/2014 | Hoon |
| 9,000,525 B2 | 4/2015 | Wen |
| 9,041,118 B2 | 5/2015 | Ando |
| 9,087,886 B2 | 7/2015 | Kim |
| 9,147,680 B2 | 9/2015 | Trevino |
| 9,184,095 B2 | 11/2015 | Scheiper |
| 9,196,696 B2 | 11/2015 | Xie |
| 9,196,699 B1 | 11/2015 | Hsu |

(Continued)

*Primary Examiner* — Michael Lebentritt
(74) *Attorney, Agent, or Firm* — Winston Hsu; Scott Margo

(57) ABSTRACT

The present invention provides a method for forming a semiconductor device having a metal gate. The method includes firstly, a substrate is provided, and a first semiconductor device and a second semiconductor device are formed on the substrate, having a first gate trench and a second trench respectively. Next, a bottom barrier layer is formed in the first gate trench and a second trench. Afterwards, a first pull back step is performed, to remove parts of the bottom barrier layer, and a first work function metal layer is then formed in the first gate trench. Next, a second pull back step is performed, to remove parts of the first work function metal layer, wherein the topmost portion of the first work function metal layer is lower than the openings of the first gate trench and the second gate trench.

10 Claims, 7 Drawing Sheets

(56) References Cited

U.S. PATENT DOCUMENTS

| | | | |
|---|---|---|---|
| 9,287,263 B1* | 3/2016 | Hsu | H01L 27/0922 |
| 2010/0311231 A1 | 12/2010 | Thei | |
| 2013/0075827 A1 | 3/2013 | Lee | |
| 2013/0099307 A1 | 4/2013 | Tseng | |
| 2013/0299914 A1 | 11/2013 | Kim | |
| 2014/0008720 A1 | 1/2014 | Xie | |
| 2014/0183652 A1 | 7/2014 | Chern | |
| 2015/0076624 A1 | 3/2015 | Liu | |

* cited by examiner

METHOD FOR MANUFACTURING SEMICONDUCTOR DEVICE HAVING METAL GATE

CROSS REFERENCE TO RELATED APPLICATIONS

This application is a divisional application of U.S. patent application Ser. No. 14/537,840 filed Nov. 10, 2014, which is herein incorporated by reference in its entirety.

BACKGROUND OF THE INVENTION

1. Field of the Invention

The invention relates to a manufacturing method for a semiconductor device having a metal gate, and more particularly, to a manufacturing method for a semiconductor device having a metal gate integrated with the gate last process and the high-k last process.

2. Description of the Prior Art

With a trend toward scaling down the size of the semiconductor device, work function metals are used to replace the conventional polysilicon gate to be the control electrode that is suitable for the high dielectric constant (hereinafter abbreviated as high-K) gate dielectric layer. The conventional dual metal gate methods are categorized into the gate first process and the gate last process. Among the two main processes, the gate last process is able to avoid processes of high thermal budget and to provide wider material choices for the high-K gate dielectric layer and the metal gate, and thus gradually replaces the gate first process.

In the conventional gate last process, a dummy gate or a replacement gate is formed on a substrate and followed by steps of forming a conventional metal-oxide semiconductor (MOS) transistor device. Subsequently, the dummy/replacement gate is removed to form a gate trench. Then the gate trench is filled with work function metals required by different conductivity types. However, each layer formed in the gate trenches reduces an opening width of the gate trench by forming overhangs. The overhang problem makes it difficult to fill the gate trench with the other material. Serious overhang problem even results in a seam in the gate trench and makes it such that the filling metal layer cannot be formed in the gate trench as desired. Eventually, the electrical performance of the transistor device having the metal gate is deteriorated.

SUMMARY OF THE INVENTION

The present invention provides a method for forming a semiconductor device having a metal gate, comprising the following steps: firstly, a substrate is provided, a first semiconductor device and a second semiconductor device are formed on the substrate, having a first gate trench and a second trench respectively. Next, a bottom barrier layer is formed in the first gate trench and the second trench. Afterwards, a first pull back step is performed, to remove parts of the bottom barrier layer, so as to form a U-shaped bottom barrier layer, and a first work function metal layer is then formed in the first gate trench. Next, a second pull back step is performed, to remove parts of the first work function metal layer, wherein the topmost portion of the first work function metal layer is lower than the openings of the first gate trench and the second gate trench, and a second work function metal layer is then formed in the first gate trench and in the second trench, wherein the topmost portion of the second work function metal layer, the opening of the first gate trench and the opening of the second trench are on the same level.

According to the manufacturing method for semiconductor device having a metal gate provided by the present invention, the first pull back step is performed to remove portions of the bottom barrier layer from the first gate trench, preferably from both of the first gate trench and the second gate trench, before forming the first work function metal layer in the first gate trench. Consequently, a wider opening of the first gate trench is at least obtained. And thus trench-filling results of the following formed layers, such as the first work function metal layer, are improved. In the same concept, the second pull back step is performed to remove the portions of the first work function metal layer from the first gate trench after forming the first work function metal layer. Accordingly, the first work function metal layer obtains a U shape. More important, topmost portions of the U-shaped bottom barrier layer and U-shaped first work function metal layer are all lower than the openings of the gate trenches. Thus the subsequently formed material, such as the second work function metal layer, the top barrier layer and the filling metal layer, are successfully formed in all gate trenches and seams are avoided. Accordingly, the manufacturing method for semiconductor device having a metal gate provided by the present invention avoids the seam and the adverse impact rendered from the seams, and thus has the advantage of improved reliability.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-11 are schematic drawings illustrating a manufacturing method for semiconductor device having a metal gate provided by a first preferred embodiment of the present invention, in which:

FIG. 1 showing a schematic cross sectional view of the semiconductor structure at the beginning of the making process;

FIG. 2 showing a schematic cross sectional view of the semiconductor structure after performing the first pull back step;

FIG. 3 showing a schematic cross sectional view of the semiconductor structure after removing the patterned mask;

FIG. 4 showing a schematic cross sectional view of the semiconductor structure after forming the first work function metal;

FIG. 5 showing a schematic cross sectional view of the semiconductor structure after forming the patterned photoresist;

FIG. 6 showing a schematic cross sectional view of the semiconductor structure after etching the exposed first work function metal layer;

FIG. 7 showing a schematic cross sectional view of the semiconductor structure after providing a patterned mask layer;

FIG. 8 showing a schematic cross sectional view of the semiconductor structure after the second pull back step by performing an etching process to remove the exposed first work function metal layer;

FIG. 9 showing a schematic cross sectional view of the semiconductor structure after removing the patterned mask layer;

FIG. 10 showing a schematic cross sectional view of the semiconductor structure after forming a filling metal layer; and FIG. 11 showing a schematic cross sectional view of the semiconductor structure after performing a planarization process.

FIGS. 2A and 11A are schematic drawings illustrating a manufacturing method for semiconductor device having a metal gate provided by a second preferred embodiment of the present invention, in which:

FIG. 2A showing a schematic cross sectional view of the semiconductor structure after performing the first pull back step according to another embodiment of the present invention;

FIG. 11A showing a schematic cross sectional view of the semiconductor structure after performing a planarization process according to another embodiment of the present invention.

DETAILED DESCRIPTION

Figure 1:
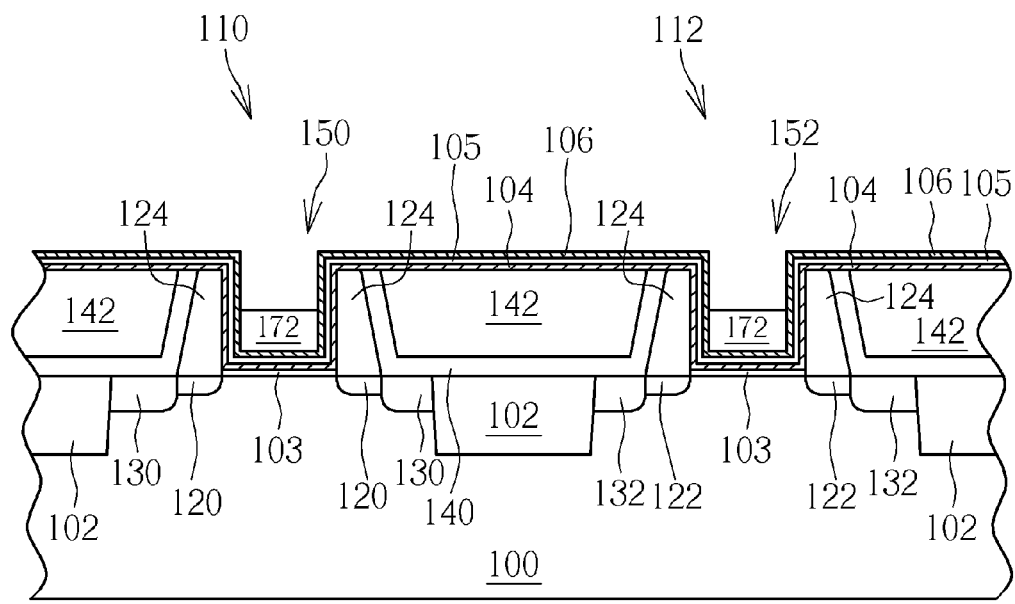

Please refer to FIGS. 1-11, which are drawings illustrating a manufacturing method for semiconductor device having a metal gate provided by a first preferred embodiment of the present invention. As shown in FIG. 1, the preferred embodiment first provides a substrate 100 such as silicon substrate, silicon-containing substrate, or silicon-on-insulator (SOI) substrate. The substrate 100 includes a first semiconductor device 110 and a second semiconductor device 112 formed thereon. A shallow trench isolation (STI) 102 is formed in the substrate 100 between the first semiconductor device 110 and the second semiconductor device 112 for providing electrical isolation. The first semiconductor device 110 includes a first conductivity type, the second semiconductor device 112 includes a second conductivity type, and the first conductivity type and the second conductivity type are complementary. In the preferred embodiment, the first conductivity type is p-type and the second conductivity type is n-type.

Please refer to FIG. 1. The first semiconductor device 110 and the second semiconductor device 112 respectively include a dielectric layer (not shown) and a dummy gate (not shown). The dielectric layer can be a conventional silicon oxide (SiO2) layer and the dummy gate can include a polysilicon layer. Furthermore, the first semiconductor device 110 and the second semiconductor device 112 respectively include first lightly doped drains (LDDs) 120 and second LDDs 122, a spacer 124, a first source/drain 130 and a second source/drain 132. Additionally, salicides (not shown) may be respectively formed on the first source/drain 130 and the second source/drain 132. After forming the first semiconductor device 110 and the second semiconductor device 112, a contact etch stop layer (CESL) 140 and an inter-layer dielectric (ILD) layer 142 are selectively formed in sequence. Since the steps and material choices for the abovementioned elements are well-known to those skilled in the art, those details are omitted herein in the interest of brevity. Furthermore, selective strain scheme (SSS) can be used in the preferred embodiment. For example, a selective epitaxial growth (SEG) method can be used to form the first source/drain 130 and the second source/drain 132.

Please still refer to FIG. 1. After forming the CESL 140 and the ILD layer 142, a planarization process is performed to remove a portion of the ILD layer 142 and a portion of the CESL 140 to expose the dummy gates of the first semiconductor device 110 and the second semiconductor device 112. Then, a suitable etching process is performed to remove the dummy gates of the first semiconductor device 110 and the second semiconductor device 112, and thus a first gate trench 150 and a second gate trench 152 are simultaneously formed in the first semiconductor device 110 and the second semiconductor device 112, respectively. The dielectric layers or the substrate 100 are respectively exposed in bottoms of the first gate trench 150 and the second gate trench 152.

Next, an interfacial layer 103 is optionally formed on the substrate 10, and afterwards, a high-k dielectric layer 104 and a bottom barrier layer 105 are sequentially formed on the substrate 100. The high-k dielectric layer 104 can include high-k material such as rare earth metal oxide. The high-k dielectric layer 104 can include material selected from the group consisting of hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalate, (SrBi2Ta2O9, SBT), lead zirconate titanate (PbZrxTi1-xO3, PZT), and barium strontium titanate (BaxSr1—xTiO3, BST). In the preferred embodiment, the bottom barrier layer may be a single layer structure or a multiple layer structure, such as comprising the bottom barrier layer 105 and the bottom barrier layer 106, wherein the bottom barrier layer 105 can include titanium nitride (TiN) and the bottom barrier layer 106 can include tantalum nitride (TaN), but not limited to this.

Figure 2:
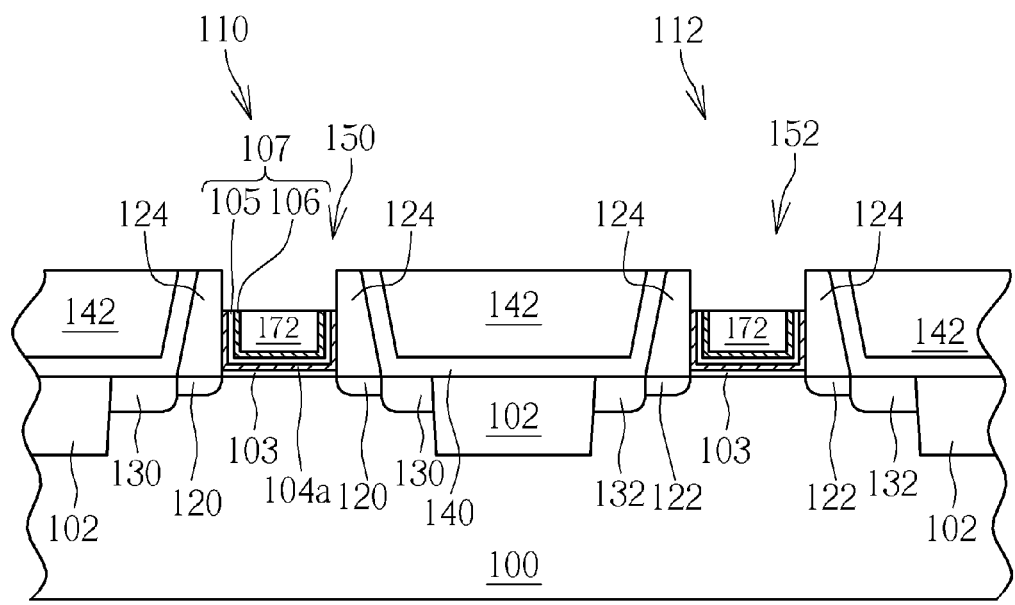

Please still refer to FIGS. 1-2. Next, a first pull back step is performed. According to the preferred embodiment, the first pull back step first forms a patterned mask 172 respectively in the first gate trench 150 and the second gate trench 152. The patterned mask 172 includes materials having superior gap-filling ability, such as photoresist materials formed by spin coating, a dielectric anti-reflection coating (DARC), a light absorbing oxide (DUO), a bottom anti-reflective coating (BARC), or a sacrificial light absorbing material (SLAM), but not limited to this. It is noteworthy that a surface of the patterned mask 172 is lower than openings of the first gate trench 150 and the second gate trench 152 as shown in FIG. 1. Accordingly, the bottom barrier layer 106 at the opening of the first gate trench 150 and the second gate trench 152 are both exposed.

Figure 2A:
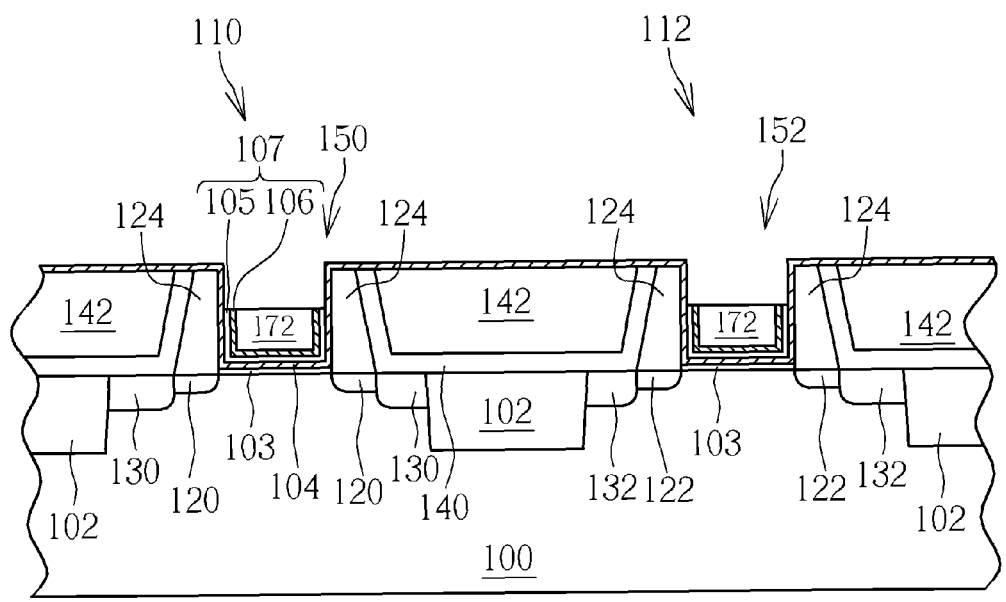

Please refer to FIG. 2. Next, the first pull back step performs an etching process to simultaneously remove parts of the bottom barrier layer 106 and parts of the bottom barrier layer 105. Besides, the high-k dielectric layer 104 can optionally be removed (or not removed) during the first pull back step simultaneously. In this embodiment, a standard cleaning (SC) process is preferably performed to remove parts of the bottom barrier layer 105 and bottom barrier layer 106. For example, using the standard SC1 solution (solution of ammonium hydroxide and hydrogen peroxide in water) to remove the TaN barrier layer, and using the standard SC2 solution (solution of hydrochloric acid and hydrogen peroxide in water) to remove the TiN barrier layer. Thus, after the first pull back step is performed, a U-shaped bottom barrier layer 107 and a U-shaped high-k dielectric layer 104a are formed in the first gate trench 150 and the second gate trench 152. It is noteworthy that in this embodiment, the topmost portion of the U-shaped bottom barrier layer 107 and the topmost portion of the U-shaped high-k dielectric layer 104a in both of the first gate trench 150 and the second gate trench 152 are all lower than the openings of the first gate trench 150 and the second gate trench 152 as shown in FIG. 2. However, in another embodiment of the present invention, since the dilute HF (DHF) is usually used to remove the high-k dielectric layer 104, considering others components may be destroyed by DHF, the high-k dielectric layer 104 may not be etched during the first pull back step. In other words, in the second preferred embodiment of the present invention (as shown in FIG. 2A), the high-k dielectric layer 104 still covers the ILD layer 142 and is not removed, and particularly covers the top surface of the openings of the first gate trench 150 and the second gate trench 152 after performing the first pull back step. The following paragraph still describes the first preferred embodiment as the example.

Figure 3:
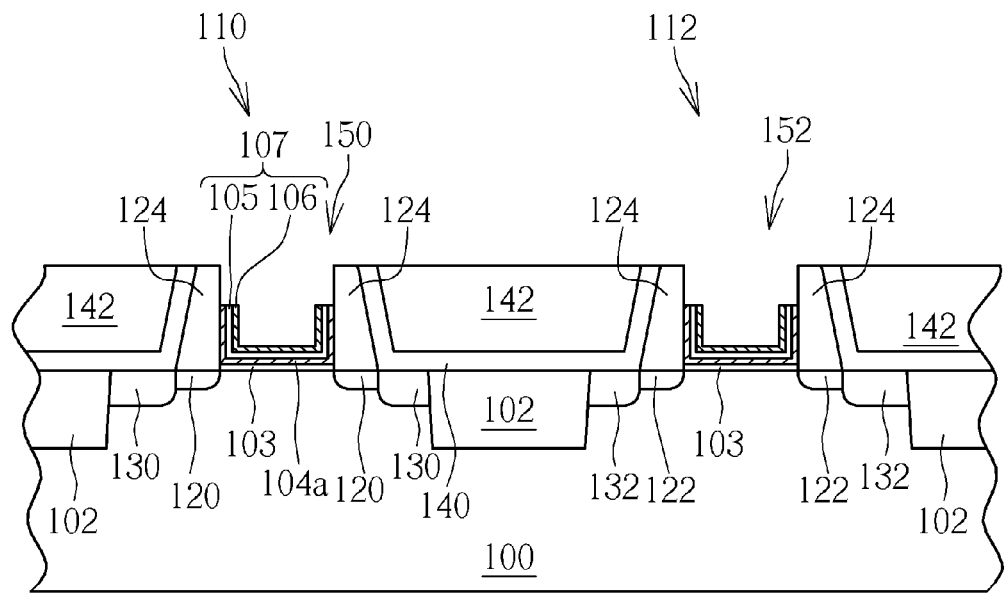
Figure 4:
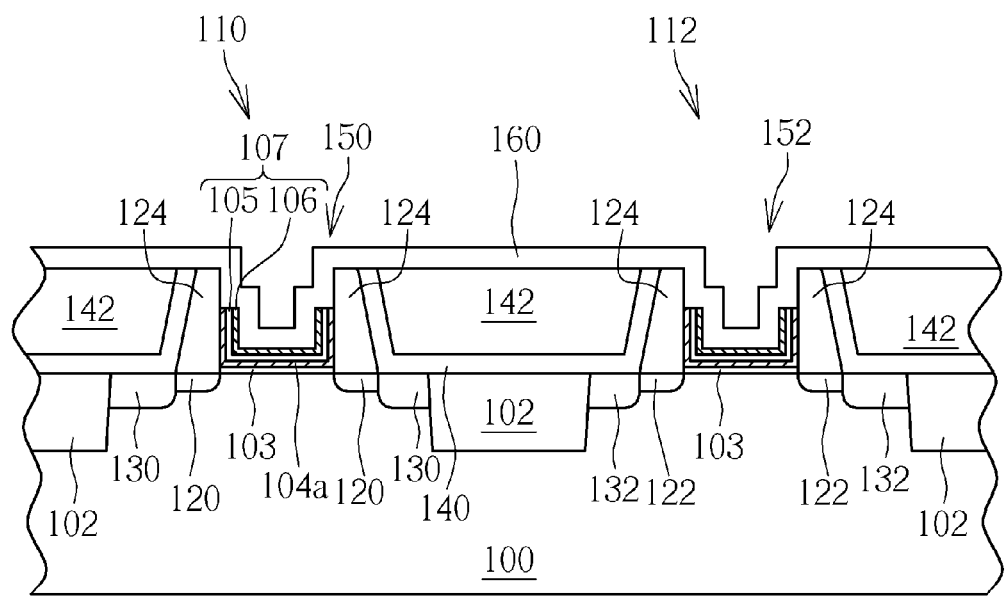

Please still refer to FIGS. 3-4. After removing the patterned mask 172, a chemical vapor deposition (CVD), a physical vapor deposition (PVD), or an atomic layer deposition (ALD) is performed to form a first work function metal layer 160 in the first gate trench 150 and the second gate trench 152. The first work function metal layer 160 is a p-type work function metal layer and exemplarily includes TiN, TaN, titanium carbide (TiC), tantalum carbide (TaC), tungsten carbide (WC), or aluminum titanium nitride (TiAlN), but not limited to this. Or the first work function metal layer 160 includes an n-type work function metal layer such as titanium aluminide (TiAl), zirconium aluminide (ZrAl), tungsten aluminide (WAl), tantalum aluminide (TaAl), or hafnium aluminide (HfAl), but not limited to this. In addition, the first work function metal layer 160 can be a single-layered structure or a multi-layered structure.

Figure 5:
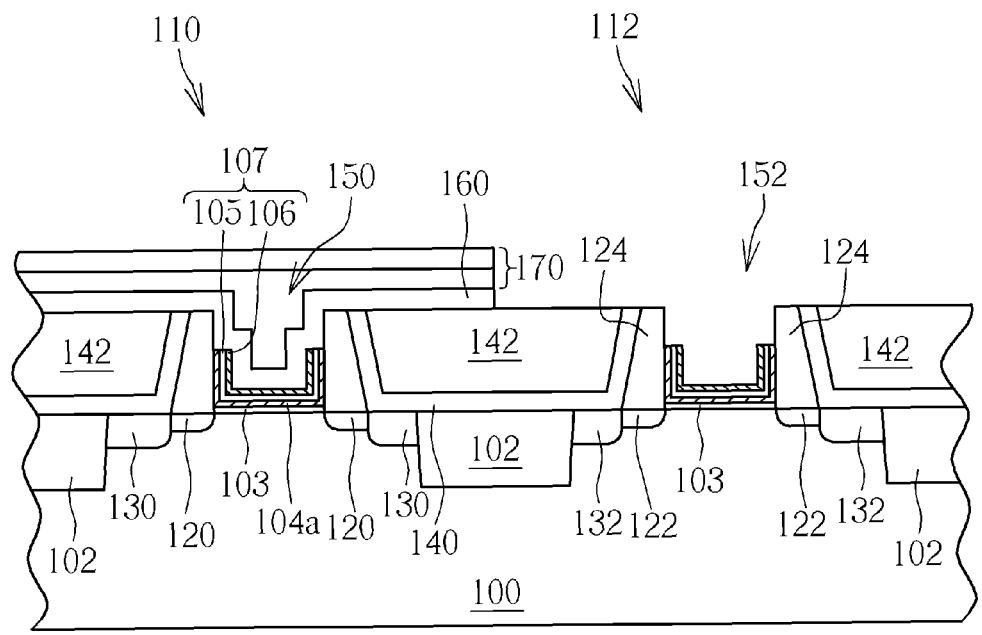
Figure 6:
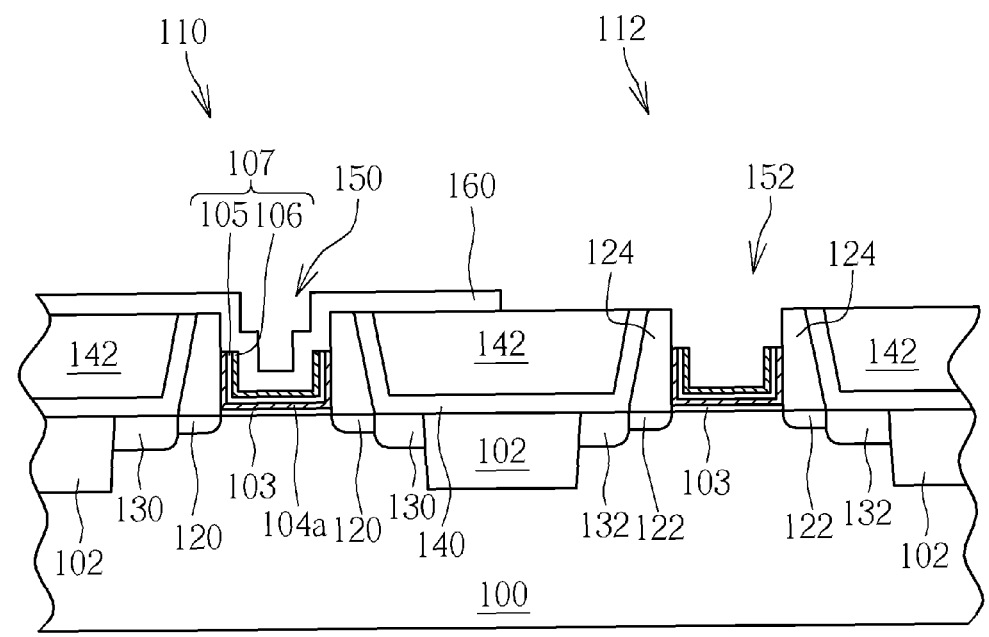

Next, as shown in FIG. 5, after forming the first work function metal layer 160, a patterned mask 170, for example but not limited to a multiple layer consisted of a bottom anti-reflection coating (BARC) layer and a patterned photoresist, is formed on the substrate 100. The patterned mask 170 covers the first semiconductor device 110 but exposes the second semiconductor device 112, and particularly exposes the first work function metal layer 160 in the second gate trench 152. Then, a suitable etchant is used to remove the exposed first work function metal layer 160 from the second gate trench 152. And thus the U-shaped bottom barrier layer 107 is exposed in the second gate trench 152. After etching the exposed first work function metal layer 160, the first work function metal layer 160 conformally remains only in the first gate trench 150 and the first semiconductor device 110 while the U-shaped bottom barrier layer 107 is exposed in the second gate trench 152 as shown in FIG. 6.

Figure 7:
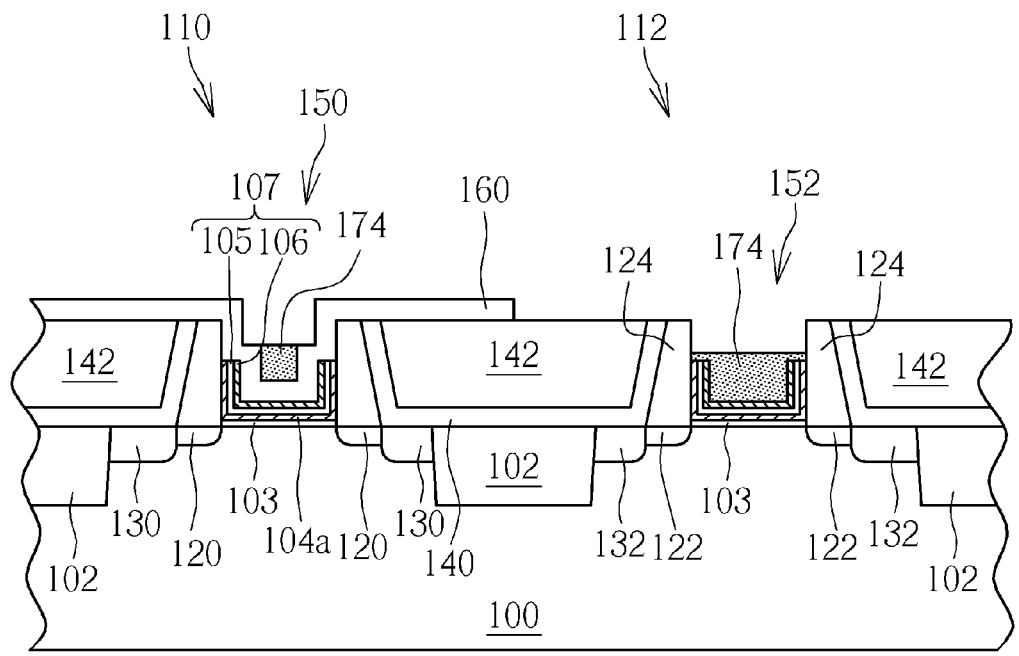
Figure 8:
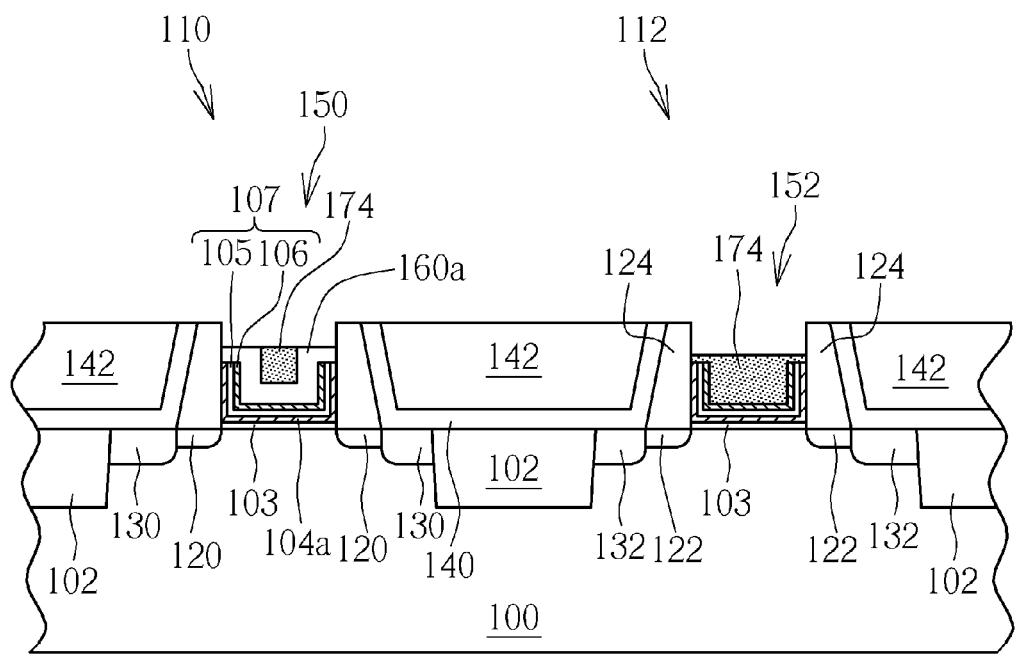

Please refer to FIGS. 7-8. Subsequently, a second pull back step is performed. According to the preferred embodiment, after the patterned mask 170 is removed, the second pull back step first provides a patterned mask layer 174, for example but not limited to a patterned photoresist layer, formed on the first work function metal layer 160 within the first gate trench 150 and on the U-shaped bottom barrier layer 107 within the second gate trench 152. It is noteworthy that, a surface of the patterned mask 174 is lower than the openings of the first gate trench 150 and the second gate trench 152, but higher than the topmost portion of the U-shaped bottom barrier layer 107. The patterned mask 174 can include materials having superior gap-filling ability as mentioned above.

Next, the second pull back step performs an etching process to remove the exposed first work function metal layer 160 from the first gate trench 150. Accordingly, a U-shaped first work function metal layer 160a is formed in the first gate trench 150 after performing the second pull back step. It is noteworthy that topmost portions of the U-shaped first work function metal layer 160a are lower than the openings of the first gate trench 150, but higher than the topmost portion of the U-shaped bottom barrier layer 107 as shown in FIG. 8. In other words, the spacer 124 is exposed on the substrate 100 again after performing the second pull back step. In another embodiment, since the high-k dielectric layer 104 is not etched during the first pull back step, the high-k dielectric layer 104 is exposed at the openings of the first gate trench 150 after the second pull back step is performed.

Figure 9:
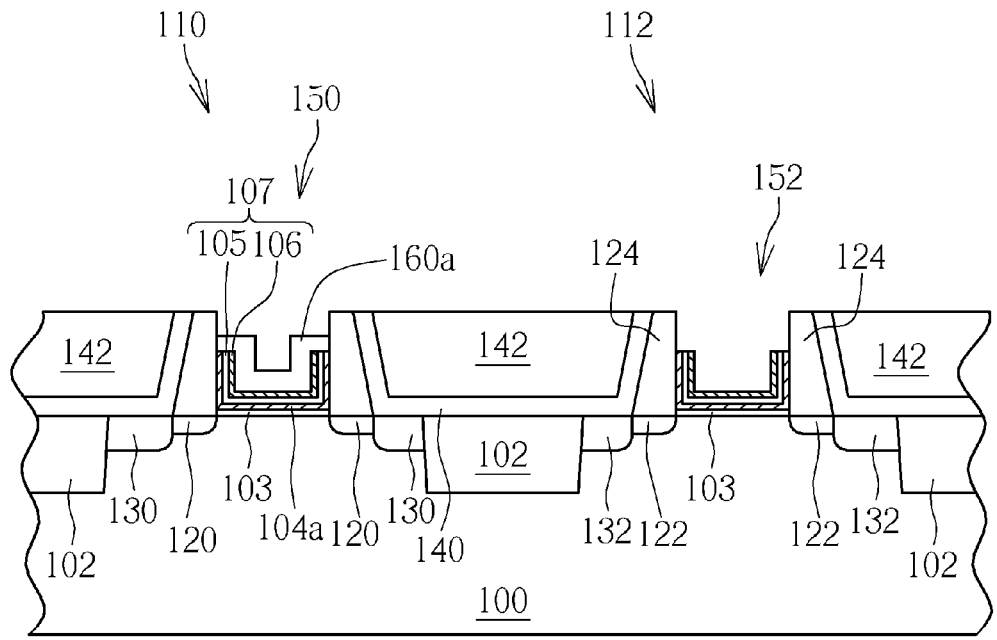
Figure 10:
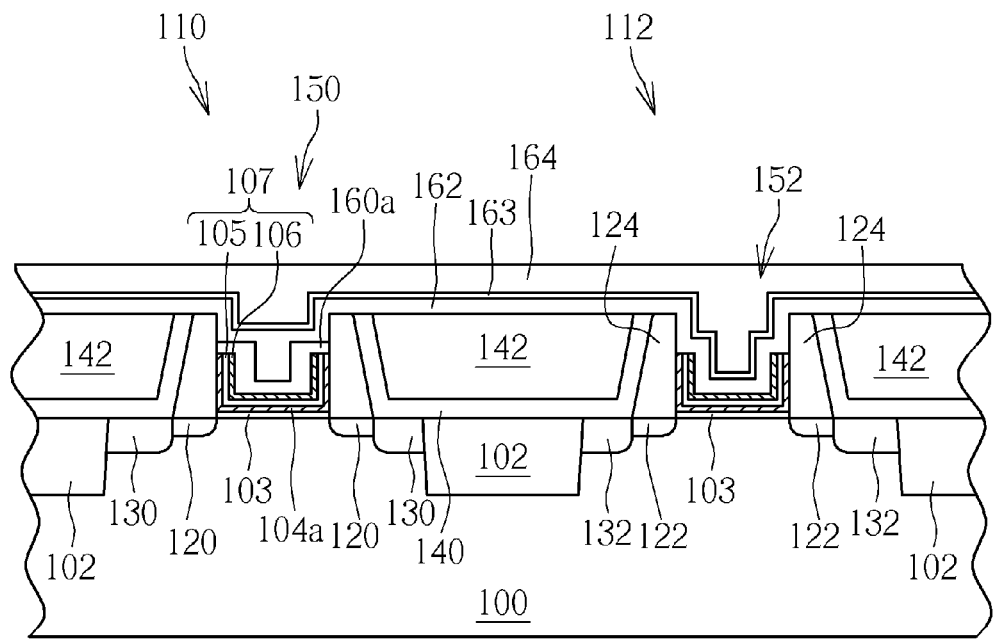

Please refer to FIGS. 9-10. After the patterned mask 172 is removed, a CVD process or a PVD process is then performed to form a second work function metal layer 162 on the substrate 100. In this embodiment, the second work function metal layer 162 includes an n-type work function metal layer such as titanium aluminide (TiAl), zirconium aluminide (ZrAl), tungsten aluminide (WAl), tantalum aluminide (TaAl), or hafnium aluminide (HfAl), but not limited to this. Or the second work function metal layer 162 is a p-type work function metal layer and exemplarily includes TiN, TaN, titanium carbide (TiC), tantalum carbide (TaC), tungsten carbide (WC), or aluminum titanium nitride (TiAlN), but not limited to this. Additionally, the second work function metal layer 162 can be a single-layered structure or a multi-layered structure.

Thereafter, a filling metal layer 164 is formed in both of the first gate trench 150 and the second gate trench 152. Additionally, a top barrier layer 163 is preferably formed between the second work function metal layer 162 and the filling metal layer 164. The top barrier layer 163 can include TiN, but not limited to this. The filling metal layer 164 is formed to fill up the first gate trench 150 and the second gate trench 152. The filling metal layer 164 includes materials with low resistance and superior gap-filling characteristic, such as Al, TiAl, or titanium aluminum oxide (TiAlO), but not limited to this.

It is noteworthy that in the present invention, the first work function metal layer 160 and the first semiconductor device 110 preferably have the same conductivity type. Take the embodiment mentioned above as an example. If the first semiconductor device 110 is p-type, and the second semiconductor device 112 is n-type, the first work function metal layer 160 is a p-type work function metal layer, and the second work function metal layer 162 is a n-type work function metal layer. However, in another embodiment of the present invention, if the first semiconductor device 110 is n-type, and the second semiconductor device 112 is p-type, the first work function metal layer 160 is a n-type work function metal layer, and the second work function metal layer 162 is a p-type work function metal layer. In this case, since the second work function metal layer 162 is a p-type work function metal layer, and the material of the second work function metal layer 162 may be the same as the material of the top barrier layer 163, such as TiN, the top barrier layer 163 is preferably omitted in that situation. Preferably, in the present invention, the first semiconductor device 110 is p-type, and the second semiconductor device 112 is n-type.

Figure 11:
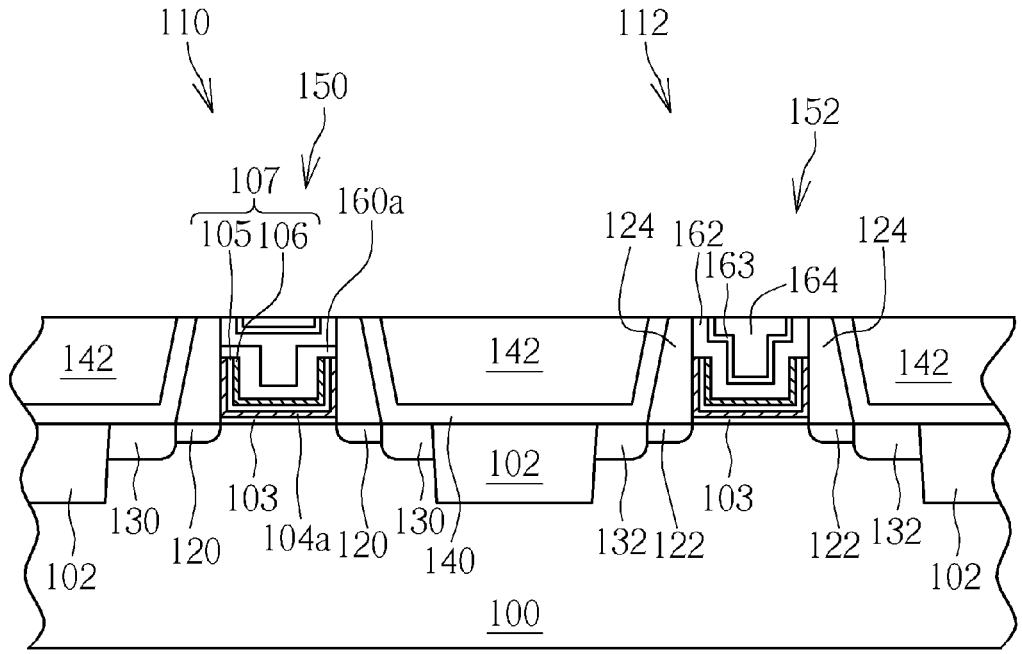

Subsequently, as shown in FIG. 11, a planarization process, such as a chemical mechanical polishing (CMP) process is performed to remove the unnecessary filling metal layer 164 and even the high-k gate dielectric layer 104 exposed on the ILD layer 142. Consequently, a first metal gate and a second metal gate are obtained. In addition, the ILD layer 140 and the CESL 142 can be selectively removed and sequentially reformed on the substrate 100 for improving performance of the semiconductor devices 110/112 in the preferred embodiment. Since the abovementioned CMP process is well-known to those skilled in the art, those details are omitted in the interest of brevity.

According to the manufacturing method for semiconductor device having a metal gate provided by the preferred embodiment, the first pull back step is performed to remove the portions of the bottom barrier layer 105 and bottom barrier layer 106 from the first gate trench 150 and the second gate trench 152 before forming the first work function metal layer 160. Therefore, the high-k dielectric layer 104 is exposed at the openings of the first gate trench 150 and the second gate trench 152, or in another case, the high-k dielectric layer 104 is partially removed during the first pull back step simultaneously, so as to expose parts of the inner surface of the first gate trench 150 and the second gate trench 152. Therefore, wider openings are obtained. Consequently, filling result of the subsequently formed first work function metal layer 160 is improved. In the same concept, the second pull back step is performed to remove the portions of the first work function metal layer 160 from the first gate trench 150 after forming the first work function metal layer 160, therefore wider openings are obtained. And thus filling the second work function metal layer 162, the top barrier layer and the metal layer 164 can be successfully formed to fill up the first gate trench 150 and the second gate trench 152 without any seam. Therefore, reliability of the first semiconductor device 110 and the second semiconductor device 112 is improved.

According to FIGS. 1-11 described above, the semiconductor device of the present invention at least comprising: a substrate 100, having a first semiconductor device 110 and a second semiconductor device 112 disposed on the substrate 100, and having a first gate trench 150 and a second trench 152 in the first semiconductor device 110 and in a second semiconductor device 112 respectively; a U-shaped bottom barrier layer 107 disposed in the first gate trench 150 and in the second trench 152 respectively; a first work function metal layer 160 in the first gate trench 150, wherein the topmost portion of the first work function metal layer 160 is lower than the opening of the first gate trench 150; a second work function metal layer 162 disposed on the first work function metal layer 160 in the first gate trench 150 and on the U-shaped bottom barrier layer 107 in the second trench 152 respectively, wherein the topmost portion of the second work function metal layer 162, the opening of the first gate trench 150 and the opening of the second trench 152 are on the same level.

Figure 11A:
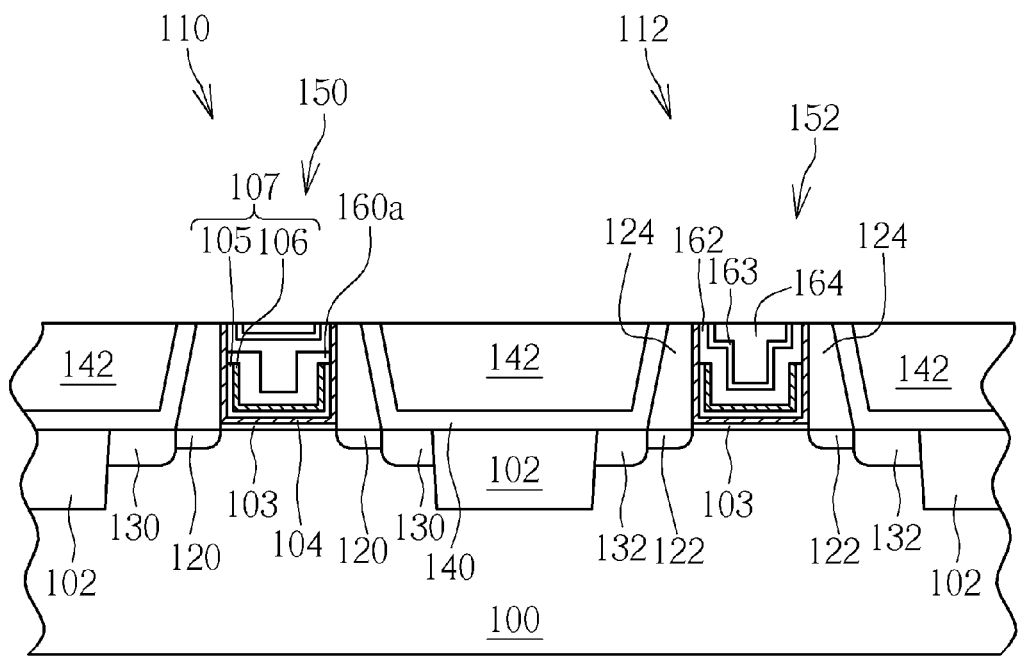

Besides, the semiconductor device may further comprise: a high-k dielectric layer 104 disposed in the first trench 150 and in the second trench 152, the topmost portion of high-k dielectric layer 104, the opening of the first gate trench 150 and the opening of the second trench 152 are on the same level (as shown in FIG. 11A). Or in another embodiment, the topmost portion of the U-shaped high-k dielectric layer 104a is lower than the opening of the first gate trench 150 and the opening of the second trench 152. The manufacturing method further comprises a filling metal layer 164 disposed on the second work function metal layer 162, and filling in the first gate trench 150 and in the second trench 152.

In one embodiment of the present invention, especially when the second work function metal layer 162 is a n-type work function metal layer, such as TiAl, the semiconductor device preferably further comprises a top barrier layer 163 disposed on the second work function metal layer 162, wherein the topmost portion of the top barrier layer 163, the opening of the first gate trench 150 and the opening of the second trench 152 are on the same level. On the other hand, when the second work function metal layer 162 is a p-type work function metal layer, such as TiN, the top barrier layer 163 can be omitted. Thereby in this case, the filling metal layer 164 may directly contact the second work function metal layer 162.

According to the manufacturing method for semiconductor device having a metal gate provided by the present invention, the first pull back step is performed to remove portions of the bottom barrier layer from the first gate trench, preferably from both of the first gate trench and the second gate trench, before forming the first work function metal layer in the first gate trench. Consequently, a wider opening of the first gate trench is at least obtained. And thus trench-filling results of the following formed layers, such as the first work function metal layer, are improved. In the same concept, the second pull back step is performed to remove the portions of the first work function metal layer from the first gate trench after forming the first work function metal layer. Accordingly, the first work function metal layer obtains a U shape. More important, topmost portions of the U-shaped bottom barrier layer and U-shaped first work function metal layer are all lower than the openings of the gate trenches. Thus the subsequently formed material, such as the second work function metal layer, the top barrier layer and the filling metal layer, are successfully formed in all gate trenches and seams are avoided. Accordingly, the manufacturing method for semiconductor device having a metal gate provided by the present invention avoids the seam and the adverse impact rendered from the seams, and thus has the advantage of improved reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device having a metal gate, comprising the following steps:
   providing a substrate, a first semiconductor device and a second semiconductor device being formed on the substrate, having a first gate trench and a second trench respectively;
   forming a bottom barrier layer in the first gate trench and the second trench;
   performing a first pull back step, to remove parts of the bottom barrier layer, and to form a U-shaped bottom barrier layer;
   forming a first work function metal layer in the first gate trench;
   performing a second pull back step, to remove parts of the first work function metal layer, wherein the topmost portion of the first work function metal layer is lower than the opening of the first gate trench; and
   forming a second work function metal layer in the first gate trench and in the second trench, wherein the topmost portion of the second work function metal layer, the opening of the first gate trench and the opening of the second trench are on the same level.

2. The method of claim 1, further comprising forming a high-k dielectric layer, and the bottom barrier layer and the high-k dielectric layer are partially removed simultaneously during the first pull back step.

3. The method of claim 1, further comprising forming a high-k dielectric layer, and only the bottom barrier layer and the high-k dielectric layer are partially removed during the first pull back step, but the high-k dielectric layer is not removed during the first pull back step.

4. The method of claim 1, wherein a conductivity type of the first work function metal layer and a conductivity type of the second work function metal layer are complementary.

5. The method of claim 4, wherein the first work function metal layer is a p-type work function metal layer, and the second work function metal layer is an n-type work function metal layer.

6. The method of claim 5, further comprising forming a top barrier layer on the second work function metal layer.

7. The method of claim 6, wherein the topmost portion of the top barrier layer, the opening of the first gate trench and the opening of the second trench are on the same level.

8. The method of claim 6, further comprising forming a filling metal layer on the top barrier layer.

9. The method of claim 4, wherein the first work function metal layer is an n-type work function metal layer, and the second work function metal layer is a p-type work function metal layer.

10. The method of claim 9, further comprising forming a filling metal layer on the second work function metal layer, the filling metal layer directly contacting the second work function metal layer.

* * * * *